US012781383B2

(12) United States Patent
Lan et al.

(10) Patent No.: US 12,781,383 B2
(45) Date of Patent: Nov. 3, 2026

(54) METHOD FOR PRODUCING NITROGEN-DOPED SINGLE CRYSTAL SILICON INGOT AND NITROGEN-DOPED SINGLE CRYSTAL SILICON INGOT

(71) Applicant: XI'AN ESWIN MATERIAL TECHNOLOGY CO., LTD., Xi'an (CN)

(72) Inventors: Xun Lan, Xi'an (CN); Yang Li, Xi'an (CN)

(73) Assignee: XI'AN ESWIN MATERIAL TECHNOLOGY CO., LTD., Xi'an (CN)

( * ) Notice: Subject to any disclaimer, the term of this patent is extended or adjusted under 35 U.S.C. 154(b) by 278 days.

(21) Appl. No.: 18/571,045

(22) PCT Filed: Sep. 29, 2022

(86) PCT No.: PCT/CN2022/122592
§ 371 (c)(1),
(2) Date: Dec. 15, 2023

(87) PCT Pub. No.: WO2023/051694
PCT Pub. Date: Apr. 6, 2023

(65) Prior Publication Data
US 2024/0287704 A1 Aug. 29, 2024

(30) Foreign Application Priority Data
Sep. 30, 2021 (CN) .......................... 202111165312.4

(51) Int. Cl.
*C30B 15/20* (2006.01)
*C30B 29/06* (2006.01)

(52) U.S. Cl.
CPC .............. *C30B 15/20* (2013.01); *C30B 29/06* (2013.01)

(58) Field of Classification Search
CPC ........ C30B 15/20; C30B 15/203; C30B 29/06
See application file for complete search history.

(56) References Cited

U.S. PATENT DOCUMENTS

2001/0008117 A1 7/2001 Park et al.
2003/0015131 A1 1/2003 Iida et al.
(Continued)

FOREIGN PATENT DOCUMENTS

CN 1206755 A 2/1999
CN 101160420 A 4/2008
(Continued)

OTHER PUBLICATIONS

English computer translation of CN-111624460-A (Year: 2025).*
(Continued)

*Primary Examiner* — Matthew J Song
(74) *Attorney, Agent, or Firm* — Maginot, Moore & Beck LLP

(57) ABSTRACT

A method for producing a nitrogen-doped single crystal silicon ingot includes, after cutting a reference ingot into sample silicon wafers, selecting a plurality of silicon wafers to be tested and evaluating a distribution of defect areas in the plurality of silicon wafers, wherein the defect areas comprise any of a pure vacancy area, a pure interstitial area, and an alternating distribution area of a pure vacancy area and a pure interstitial area. The method also includes determining a distribution position of each defect area in the reference ingot based on the distribution of the defect areas in the plurality of silicon. Then, in a production process of the nitrogen-doped single crystal silicon ingot, a pulling is performed at a set target pulling speed corresponding to each defect area which refers to the distribution position of each defect area in the reference nitrogen-doped single crystal silicon ingot.

5 Claims, 5 Drawing Sheets

(56) References Cited

U.S. PATENT DOCUMENTS

| | | | | |
|---|---|---|---|---|
| 2009/0000535 | A1 * | 1/2009 | Ebara | H10P 36/20 257/E21.321 |
| 2009/0007839 | A1 * | 1/2009 | Ebara | H01L 21/3225 257/E21.321 |
| 2015/0354089 | A1 | 12/2015 | Sonokawa et al. | |
| 2022/0098757 | A1 * | 3/2022 | Takanashi | C30B 29/06 |
| 2022/0333269 | A1 | 10/2022 | Wei et al. | |

FOREIGN PATENT DOCUMENTS

| | | | | | |
|---|---|---|---|---|---|
| CN | 104995340 | A | | 10/2015 | |
| CN | 110541191 | A | | 12/2019 | |
| CN | 111624460 | A | * | 9/2020 | G01R 31/2648 |
| CN | 111809230 | A | | 10/2020 | |
| CN | 113138195 | A | | 7/2021 | |
| CN | 113897671 | A | | 1/2022 | |
| JP | 2006312576 | A | | 11/2006 | |
| JP | 2017132686 | A | | 8/2017 | |
| JP | 2017183471 | A | | 10/2017 | |
| KR | 20010105392 | A | | 11/2001 | |
| KR | 20030039512 | A | | 5/2003 | |
| TW | 512465 | B | | 12/2002 | |

OTHER PUBLICATIONS

Japanese Office Action corresponding to Japanese Patent Application No. 2023-578114, dated Dec. 24, 2024. (9 Pages).

Korean Office Action corresponding to Korean Patent Application No. 10-2023-7043384, dated Jun. 19, 2024. (7 Pages).

English Translation of Korean Office Action corresponding to Korean Patent Application No. 10-2023-7043384, dated Jun. 19, 2024. (7 Pages).

Machine English Translation of KR20030039512A. (17 Pages).

Written Opinion and International Search Report of the International Search Authority corresponding to International Application No. PCT/CN2022/122592, dated Dec. 15, 2022. (8 pages).

English Translation of Written Opinion and International Search Authority corresponding to International Application No. PCT/CN2022/122592, dated Dec. 15, 2022. (5 pages).

Chinese Office Action corresponding to Chinese Patent Application No. 202111165312.4, dated Jun. 1, 2022. (8 Pages).

English Translation of Chinese Office Action corresponding to Chinese Patent Application No. 202111165312.4, dated Jun. 1, 2022. (4 Pages).

Taiwanese Office Action corresponding to Taiwanese Patent Application No. 111129967, dated May 23, 2023. (6 Pages).

English Translation of Taiwanese Office Action corresponding to Taiwanese Patent Application No. 111129967, dated May 23, 2023. (2 Pages).

Machine English Translation of CN113897671A. (16 Pages).

Machine English Translation of CN111624460A. (12 Pages).

Machine English Translation of CN110541191A. (33 Pages).

Machine English Translation of CN101160420A. (26 Pages).

Machine English Translation of CN111809230A. (23 Pages).

German Office Action corresponding to German Patent Application No. 11 2022 002 595.6, dated Jul. 24, 2025. (14 Pages).

Voronkov, V.V.: The mechanism of swirl defects formation in silicon. In: Journal of Crystal Growth, Bd. 59, 1982, H. 3, S. 625-643. ISSN 1873-5002 (E); 0022-0248 (P). https://doi.org/10.1016/0022-0248(82)90386-4 [abgerufen am Jan. 12, 2016] (19 Pages).

* cited by examiner

METHOD FOR PRODUCING NITROGEN-DOPED SINGLE CRYSTAL SILICON INGOT AND NITROGEN-DOPED SINGLE CRYSTAL SILICON INGOT

CROSS-REFERENCE TO RELATED APPLICATION

The present application is a U.S. national phase application of a PCT Application No. PCT/CN2022/122592 filed on Sep. 29, 2022, which claims priority to the Chinese patent application No. 202111165312.4 filed in China on Sep. 30, 2021, a disclosure of which is incorporated herein by reference in its entirety.

TECHNICAL FIELD

The present disclosure relates to the field of semiconductor technology, in particular to a method for producing nitrogen-doped single crystal silicon ingot and a nitrogen-doped single crystal silicon ingot.

BACKGROUND

A silicon wafer used as a substrate for semiconductor integrated circuits is mainly produced by slicing a single crystal silicon ingot pulled by the Czochralski (Czochralski) method. The Czochralski method includes melting polysilicon in a quartz crucible to acquire a silicon melt, immersing a monocrystalline seed into the silicon melt, and continuously pulling the seed to move away from the surface of the silicon melt, thereby a monocrystalline silicon ingot is grown at the phases-interface during pulling.

SUMMARY

In view of this, the embodiments of the present disclosure aim to provide a production method for producing nitrogen-doped single crystal silicon ingot and a nitrogen-doped single crystal silicon ingot. It is possible to produce nitrogen-doped single crystal silicon ingots with only the pure vacancy area, thereby a higher proportion of silicon wafers with highly clean surfaces are able to be obtained in the silicon wafers cut from the entire doped single crystal silicon ingot compared to the related technology.

The technical solutions of the embodiments of the application are implemented as follows:

According to a first aspect, the embodiments of the present disclosure provide a method for producing a nitrogen-doped single crystal silicon ingot, comprising:

- after cutting a reference nitrogen-doped single crystal silicon ingot into sample silicon wafers, selecting a plurality of silicon wafers to be tested and evaluating distribution of defect areas in the plurality of silicon wafers to be tested; where the defect areas include a pure vacancy area, a pure interstitial area, and an alternating distribution area of a pure vacancy area and a pure interstitial area;
- determining a distribution position of each defect area in the reference nitrogen-doped single crystal silicon ingot based on the distribution of the defect areas in the plurality of silicon wafers to be tested;
- in a production process of the nitrogen-doped single crystal silicon ingot, the nitrogen-doped single crystal silicon ingot is produced by performing a pulling at a set target pulling speed corresponding to each defect area which refers to the distribution position of each defect area in the reference nitrogen-doped single crystal silicon ingot.

According to a second aspect, the embodiments of the present disclosure provide a nitrogen-doped single crystal silicon ingot, the nitrogen-doped single crystal silicon ingot is produced by the method described in the first aspect.

DETAILED DESCRIPTION

Figure 1:
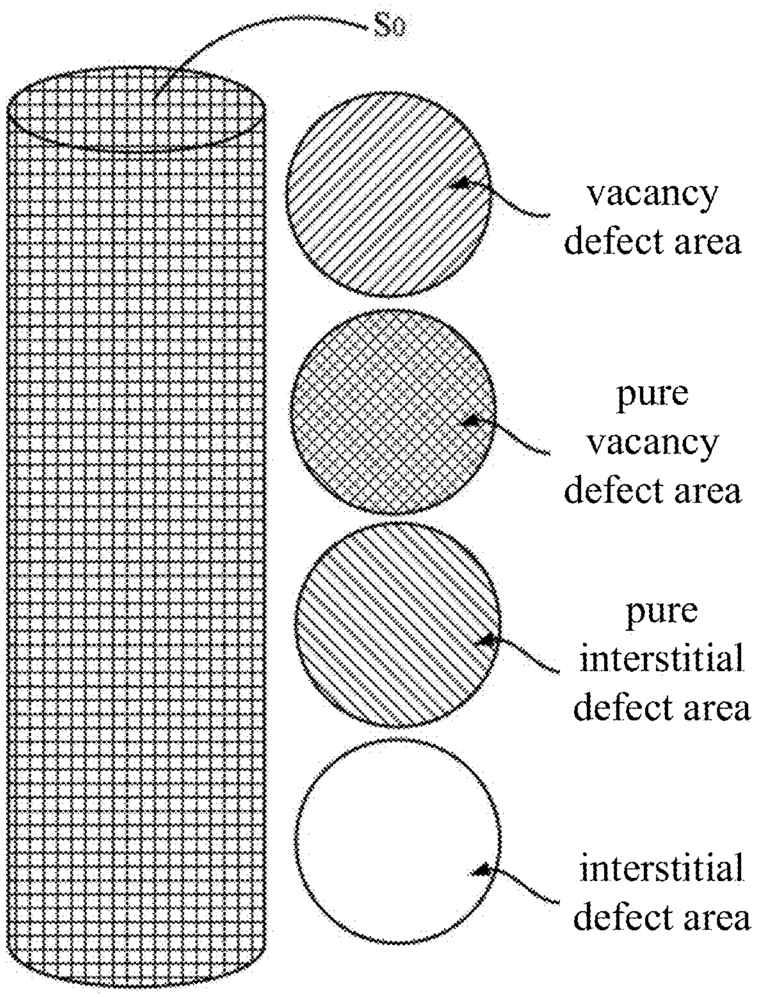
FIG. 1 is a schematic diagram of a distribution position of various defects areas present in a conventional nitrogen-free-doped single crystal silicon ingot provided in the embodiments of the present disclosure.

The technical solutions in the present disclosed embodiments will be described clearly and completely in the following in conjunction with the accompanying drawings in the present disclosed embodiments.

In the production process, it is advantageous to provide such a silicon wafer that has a Denuded Zone (DZ) extending into the body from the front surface and a Bulk Micro Defect (BMD) zone adjacent to the DZ and further extending into the body. The front surface refers to a surface of the silicon wafer on which electronic components are to be formed. The above-mentioned DZ is important, the reasons are as follows: in order to form electronic components on a silicon wafer, it is required that there is no crystal defect in the formation area of electronic components, otherwise it will lead to circuit breakage and other faults. Thus, the electronic components can be formed in the DZ to avoid the influence of crystal defects. The effect of the above BMD is that it can produce an Intrinsic Getter (IG) effect on metal impurities to keep metal impurities in silicon wafers away from the DZ. Thus, the adverse effects such as the increase of leakage current and the reduction of gate oxide film quality caused by metal impurities can be avoided.

In the process of producing the above-mentioned silicon wafers with BMD zones, it is advantageous to dope silicon wafers with nitrogen. For example, in the case of a silicon wafer doped with nitrogen, it is possible to promote the formation of BMD with nitrogen as the core, so that the BMD can reach a certain density and effectively play a role as a source for absorbing metal impurities. Moreover, it is also have a beneficial effect on the density distribution of the BMD, such as making the density of the BMD more uniformly distributed in the radial direction of the silicon wafer, for another example, making the density of the BMD higher in the region adjacent to the DZ and gradually decreasing toward the silicon wafer body, etc.

However, a conventional growth process of a nitrogen-doped single crystal silicon ingot requires not only an addition of nitrogen elements into the silicon melt, but also a heat treatment process of the silicon wafers produced from the nitrogen-doped single crystal silicon ingot to help the BMD is generated inside the silicon wafer, impurities on the surface of the silicon wafer is adsorbed near the BMD, and the cleanliness quality of the silicon wafer surface is improved. On the other hand, currently, when producing an entire doped single crystal silicon ingot, due to a constant ratio of the pulling speed to the crystal temperature in the direction of the pulling axis (V/G), the produced doped single crystal silicon ingot will contain various native defects, resulting in uneven BMD content and density of the entire doped single crystal silicon ingot. As a result, the silicon wafers with highly clean surfaces account for a low proportion in silicon wafers cut from the entire doped single crystal silicon ingot, resulting in waste of the doped single crystal silicon ingot.

Refer to FIG. 1, FIG. 1 shows a schematic diagram of a distribution position of various defects areas present in a conventional nitrogen-free-doped single crystal silicon ingot $S_0$. In the embodiments of the present disclosure, the distribution of the various defects areas is specifically displayed in a radial cross-section. As shown in FIG. 1, the conventional nitrogen-free-doped single crystal silicon ingot $S_0$ mainly includes a vacancy defect area (shown in a left diagonal filled area), a pure vacancy area (shown in a diamond filled area), a pure interstitial area (shown in a right diagonal filled area), and an interstitial defect area (shown in a blank filled area). The vacancy defect area contains larger size vacancy defects, such as Crystal Originated Particle (COP), Flow Pattern Defect (FPD) in the nitrogen-doped single crystal silicon ingot. These defects are formed by diffusion and aggregation of vacancy point defects during a cooling process. The interstitial defect area contains large size interstitial defects, such as Dislocation, Slip. These defects are formed by the diffusion and aggregation of Point Defects during the cooling process. The pure vacancy area is an oxygen precipitation promotion, which produce oxygen precipitation. The pure interstitial area is located between the pure vacancy area and the interstitial defect area, which is an oxygen precipitation inhibition area that does not produce oxygen precipitation. The pure vacancy area and the pure interstitial area both contain very small defects with a defect order at the nanoscale. Therefore, these two areas are considered as defect free areas with very few original defects.

Figure 2:
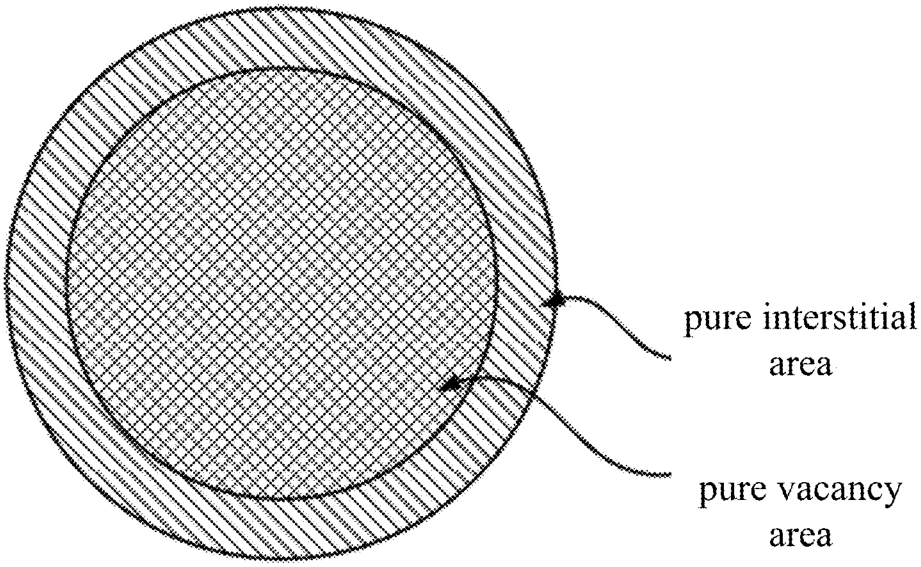
FIG. 2 is a schematic diagram of a form of alternating distribution of a pure vacancy area and a pure interstitial area provided in the embodiments of the present disclosure.
Figure 3:
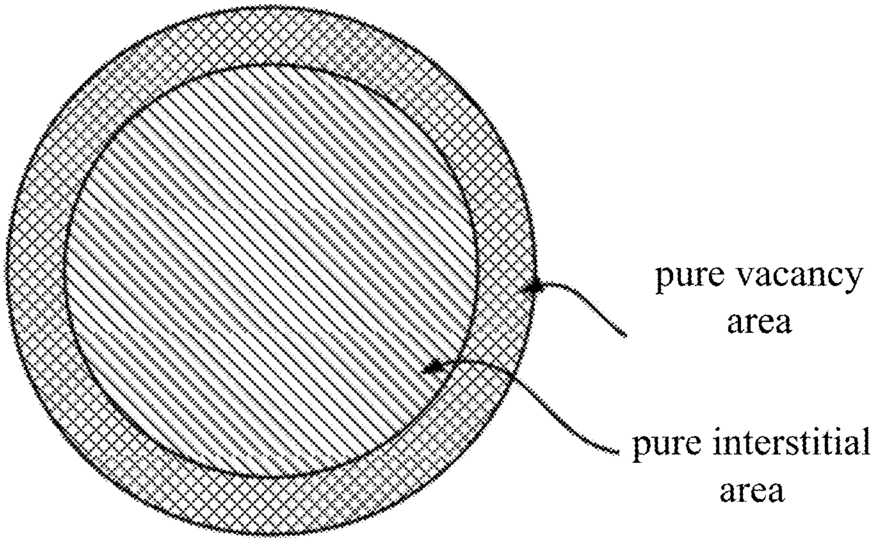
FIG. 3 is a schematic diagram of another form of alternating distribution of the pure vacancy area and the pure interstitial area provided in the embodiments of the present disclosure.

At present, most of the defect-free-nitrogen-doped single crystal silicon ingots on market are mainly distributed alternately in the pure vacancy area and the pure interstitial area. It should be noted that the alternating distribution of the pure vacancy area and the pure interstitial area is mainly classified into two forms, as shown in FIG. 2 and FIG. 3.

On the other hand, the BMD is formed by a deposition of impurity oxygen in the vacancy defect. In actual production, the BMD will deposit in the vacancy defect area and the pure vacancy area. If a single crystal silicon ingot contains a vacancy defect area, the integrity of a gate oxide film of the silicon wafer produced from the single crystal silicon ingot will be affected. For the pure interstitial area, the BMD cannot be formed due to the inability to deposit impurity oxygen. In summary, the nitrogen-doped single crystal silicon ingot with only the pure vacancy area can generate high-density BMD, thereby obtaining the silicon wafers with highly clean surfaces. However, currently, there are defect areas in the defect-free-nitrogen-doped single crystal silicon ingots on the market, including the pure vacancy area, the pure interstitial area, and the defect area alternately distributed between the pure vacancy area and the pure interstitial area. The situation will lead to a low proportion of the silicon wafers with highly clean surfaces in the entire nitrogen-doped single crystal silicon ingot.

Based on the above explanation, in order to achieve a uniform content of the BMD in the entire nitrogen-doped single crystal silicon ingot and increase the proportion of the silicon wafers with highly clean surfaces, the embodiments of the present disclosure is expected to produce a nitrogen-doped single crystal silicon ingot with only the pure vacancy area by controlling and adjusting the parameter V/G, thereby obtaining a higher proportion of the silicon wafers with highly clean surfaces compared to the related technology. However, for a fixed Hot Zone structure, the G value is certain, so in the embodiments of the present disclosure, it is expected to obtain the nitrogen-doped single crystal silicon ingot with only the pure vacancy area by adjusting the pulling speed V. Therefore, referring to FIG. 4, the embodiments of the present disclosure provide a method for producing a nitrogen-doped single crystal silicon ingot, which comprises:

S401: after cutting a reference nitrogen-doped single crystal silicon ingot into sample silicon wafers, selecting a plurality of silicon wafers to be tested and evaluating distribution of defect areas in the plurality of silicon wafers to be tested; where the defect areas include a pure vacancy area, a pure interstitial area, and an alternating distribution area of a pure vacancy area and a pure interstitial area;

S402: determining a distribution position of each defect area in the reference nitrogen-doped single crystal silicon ingot based on the distribution of the defect areas in the plurality of silicon wafers to be tested;

S403: in a production process of the nitrogen-doped single crystal silicon ingot, the nitrogen-doped single crystal silicon ingot is produced by performing a pulling at a set target pulling speed corresponding to each defect area which refers to the distribution position of each defect area in the reference nitrogen-doped single crystal silicon ingot.

Figure 4:
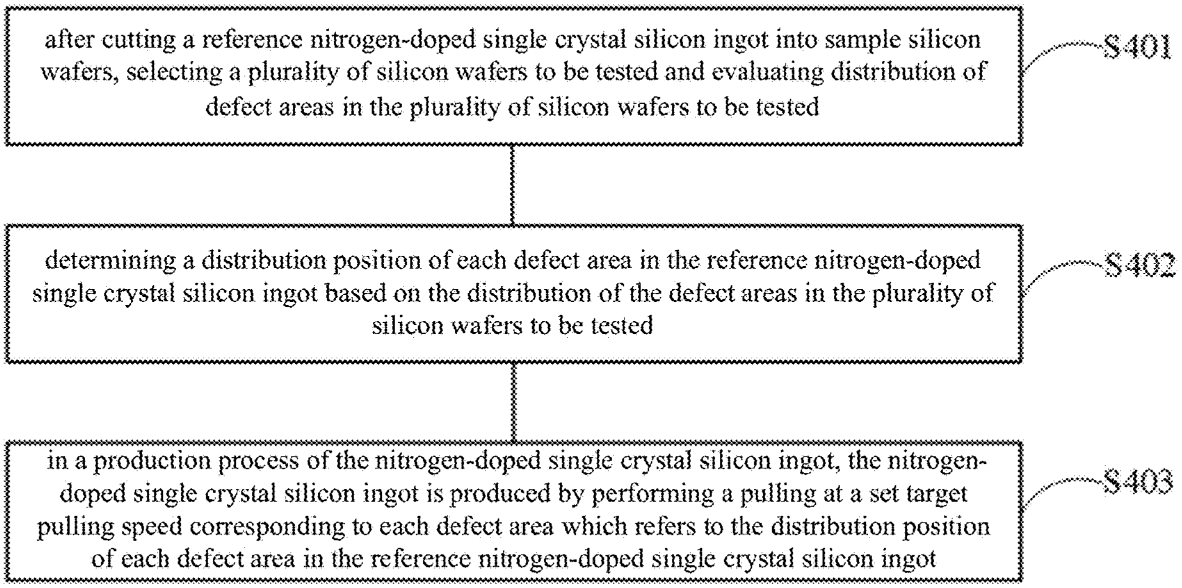
FIG. 4 is a schematic flowchart of a method for producing a nitrogen-doped single crystal silicon ingot provided in the embodiments of the present disclosure.

For the technical solutions shown in FIG. 4, it is possible to determine the distribution position of each defect area in the reference nitrogen-doped single crystal silicon ingot based on the distribution of the defect areas in the plurality of silicon wafers to be tested. Therefore, in the production process of the nitrogen-doped single crystal silicon ingot, when it is pulled to the distribution position of each defect area in the reference nitrogen-doped single crystal silicon ingot, the nitrogen-doped single crystal silicon ingot is produced by pulling according to the set target pulling speed corresponding to each defect area. Through the production method, it is possible to achieve segmented adjustment of the target pulling speed of the single crystal silicon ingot, in order to obtain the nitrogen-doped single crystal silicon ingot with only the pure vacancy area, and more silicon wafers with highly clean surfaces are able to be obtained.

For the technical solutions shown in FIG. 4, in some examples, after cutting the reference nitrogen-doped single crystal silicon ingot into the sample silicon wafers, the selecting the plurality of silicon wafers to be tested and evaluating the distribution of the defect areas in the plurality of silicon wafers to be tested, comprising:

producing the reference nitrogen-doped single crystal silicon ingot at a reference pulling speed, and cutting the reference nitrogen-doped single crystal silicon ingot to obtain the sample silicon wafers;

selecting the plurality of sample silicon wafers located at different positions of the reference nitrogen-doped single crystal silicon ingot as the silicon wafers to be tested, and evaluating the distribution of the defect areas in the plurality of silicon wafers to be tested.

Figure 5:
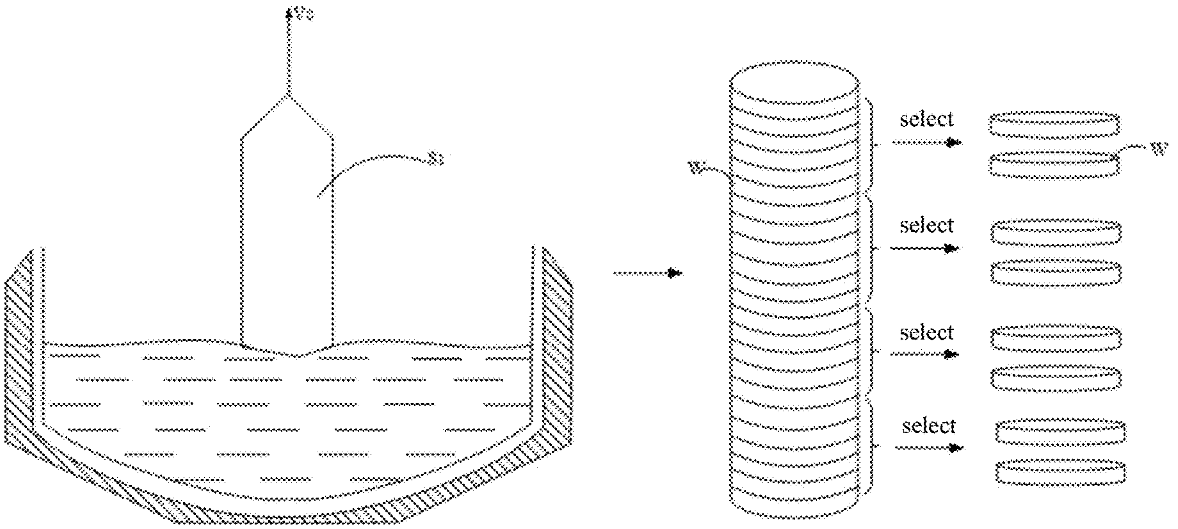
FIG. 5 is a schematic diagram of a process flow for obtaining silicon wafers to be tested using a reference nitrogen-doped single crystal silicon ingot provided in the embodiments of the present disclosure.

It can be understood that, as shown in FIG. 5, after the reference nitrogen-doped single crystal silicon ingot $S_1$ is produced at the reference pulling speed $V_0$, in order to determine the distribution of the defect areas in the reference nitrogen-doped single crystal silicon ingot $S_1$, in the embodiments of the present disclosure, cutting the reference nitrogen-doped single crystal silicon ingot $S_1$ to obtain the plurality of sample silicon wafers W, and selecting a part of the sample silicon wafers W from the plurality of sample silicon wafers as the silicon wafers to be tested W for the evaluation of the distribution of the defect areas.

It should be noted that the number of the selected silicon wafers to be tested W is based on the actual situation.

On the other hand, in order to fully obtain the distribution of the defect areas at various positions in the reference nitrogen-doped single crystal silicon ingot, in the embodiments of the present disclosure, the silicon wafers to be tested W are selected respectively from the sample silicon wafers W located at various positions in the head, middle, and tail of the reference nitrogen-doped single crystal silicon ingot $S_1$, as shown in FIG. 5. However, it should be noted that the method for selecting the silicon wafers to be tested W in the embodiments of the present disclosure is not limited to the selection method specified in the above and FIG. 5, and can be adjusted according to the actual situation.

For the above examples, in some specific implementation methods, the evaluating the distribution of the defect areas in the plurality of silicon wafers to be tested comprises:

obtaining minority carrier lifetime data on surfaces of the plurality of silicon wafers to be tested, and draw minority carrier lifetime maps based on the minority carrier lifetime data on the surfaces of the plurality of silicon wafers to be tested;

evaluating the distribution of the defect areas of the plurality of silicon wafers to be tested based on the minority carrier lifetime maps.

For the above examples, in some specific embodiments, the evaluating the distribution of the defect areas in the plurality of silicon wafers to be tested based on the minority carrier lifetime maps, comprising:

when the minority carrier lifetime map is map in a circle shape with a long lifetime, determining the silicon wafer to be tested corresponding to the map in a circle shape with a long lifetime is a first silicon wafer to be tested containing only the pure vacancy area; and, when the minority carrier lifetime map is map in a ring shape with a short lifetime, determining the silicon wafer to be tested corresponding to the map in a ring shape with a short lifetime is a second silicon wafer to be tested containing the pure interstitial area surrounding the pure vacancy area; and, when the minority carrier lifetime map is map in a ring shape with a long lifetime, determine the silicon wafer to be tested corresponding to the map in a ring shape with a long lifetime is a third silicon wafer to be tested containing the pure vacancy area surrounding the pure interstitial area; and, when the minority carrier lifetime map is a map in a circle shape with a short lifetime, determine the silicon wafer to be tested corresponding to the map in a circle shape with a short lifetime is a fourth silicon wafer to be tested containing only the pure interstitial area.

It should be noted that the minority carrier lifetime data on the surface of the silicon wafer to be tested W can be obtained through a microwave photoconductivity decay method, and the specific method is not be elaborated in the application.

It can be understood that in the embodiments of the present disclosure, the minority carrier lifetime of the silicon wafer to be tested refers to an average time of minority carrier recombination in an excited hole-electron pair under energy excitation greater than a semiconductor bandgap width (1.12 eV). In the embodiments of the present disclosure, the hole is majority carrier and the electron is minority carrier. The formation of a pure vacancy defect is due to a promotion of oxygen precipitation during a growing process, resulting in a circle shaped pure vacancy area. Therefore, the average time of the minority carrier recombination in this area is long, and the minority carrier lifetime map containing only the pure vacancy area is in the map in a circle shape with a long lifetime. Therefore, by scanning the minority carrier lifetime map of the entire surface of the silicon wafer to be tested, it can be determined that the silicon wafer to be tested corresponding to the map in a circle shape with a long lifetime is the first silicon wafer to be tested containing only the pure vacancy area.

Similarly, the formation of a pure interstitial defect is due to an inhibition of the oxygen precipitation during the growing process, resulting in a circle shaped pure interstitial area. Therefore, the average time of the minority carrier recombination in this area is short, and the minority carrier lifetime map containing only the pure interstitial area is in the map in a circle shape with a short lifetime. Therefore, by scanning the minority carrier lifetime map of the entire surface of the silicon wafer to be tested, it can be determined that the silicon wafer to be tested corresponding to the map in a circle shape with a short lifetime is the fourth silicon wafer to be tested containing only the pure interstitial area. Therefore, by analyzing the minority carrier lifetime maps, it is possible to distinguish between the pure vacancy area and the pure interstitial area.

At the same time, for the second silicon wafer to be tested that contains the pure interstitial area surrounding the pure vacancy area, due to the longer minority carrier lifetime in the pure vacancy area compared to the minority carrier lifetime in the pure interstitial area, as shown in FIG. 2, a graph containing the distribution of the pure interstitial area surrounding the pure vacancy area forms a minority carrier lifetime map with the map in a circle shape with a short lifetime. For the third silicon wafer to be tested containing the pure vacancy area surrounding the pure interstitial area, due to the fact that the minority carrier lifetime in the pure vacancy area is longer than the minority carrier lifetime in the pure interstitial area, as shown in FIG. 3, a graph containing the distribution of the pure vacancy area surrounding the pure interstitial area forms a minority carrier lifetime map with the map in a circle shape with a long lifetime.

For the technical solutions shown in FIG. 4, in some examples, the determining the distribution position of each defect area in the reference nitrogen-doped single crystal silicon ingot based on the distribution of the defect areas in the plurality of silicon wafers to be tested, comprising:

based on a position of a first silicon wafer to be tested containing only the pure vacancy area, determining a distribution position I of the pure vacancy area in the reference nitrogen-doped single crystal silicon ingot; and, based on a position of a second silicon wafer to be tested containing the pure interstitial area surrounding the pure vacancy area, determining a distribution position II of the pure interstitial area surrounding the pure vacancy area in the reference nitrogen-doped single crystal silicon ingot; and, based on a position of a third silicon wafer to be tested containing the pure vacancy area surrounding the pure interstitial area, determining a distribution position III of the pure vacancy area surrounding the pure interstitial area in the reference nitrogen-doped single crystal silicon ingot; and, based on a position of a fourth silicon wafer to be tested containing only the pure interstitial area, determining a distribution position IV of the pure interstitial area in the reference nitrogen-doped single crystal silicon ingot.

Figure 6:
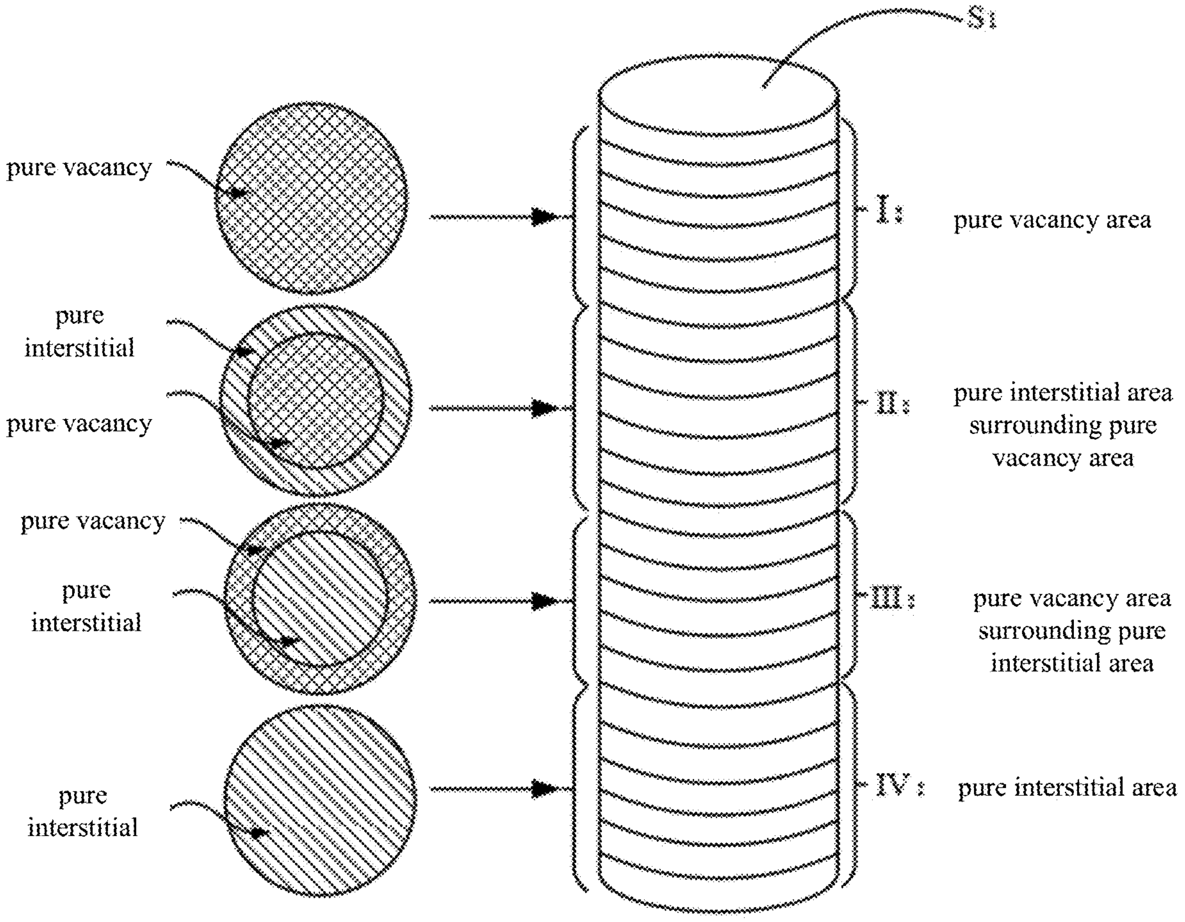
FIG. 6 is a schematic diagram of positions corresponding to different defect areas in the reference nitrogen-doped single crystal silicon ingot provided in the embodiments of the present disclosure.

It can be understood that, as shown in FIG. 6, after evaluating the defects in the plurality of silicon wafers to be tested and determining the distribution of the defects in each silicon wafer to be tested, it is possible to determine types of the defects and positions of the defect areas in different positions of the reference nitrogen-doped single crystal silicon ingot corresponding to each silicon wafer to be tested.

For the technical solutions shown in FIG. 4, in some examples, in the production process of the nitrogen-doped single crystal silicon ingot, the producing the nitrogen-doped single crystal silicon ingot by performing a pulling at the set target pulling speed corresponding to each defect area which refers to the distribution position of each defect area in the reference nitrogen-doped single crystal silicon ingot, comprising:

when a Hot Zone structure of the nitrogen-doped single crystal silicon ingot is consistent with a Hot Zone structure of the reference nitrogen-doped single crystal silicon ingot, in the production process of the nitrogen-doped single crystal silicon ingot:

based on the distribution position I of the pure vacancy area in the reference nitrogen-doped single crystal silicon ingot, performing a pulling using a reference pulling speed; and, based on the distribution position II of the pure interstitial area surrounding the pure vacancy area in the reference nitrogen-doped single crystal silicon ingot, performing a pulling using a first target pulling speed $V_1$; and, based on the distribution position III of the pure vacancy area surrounding the pure interstitial area in the reference nitrogen-doped single crystal silicon ingot, performing a pulling using a second target pulling speed $V_2$; and, based on the distribution position IV of the pure interstitial area in the reference nitrogen-doped single crystal silicon ingot, performing a pulling using a third pulling speed $V_3$.

For the above examples, in some specific embodiments, the first target pulling speed $V_1$ is the reference pulling speed $V_0$±0.001 mm/min to 0.002 mm/min; and, the second target pulling speed $V_2$ is the reference pulling speed $V_0$±0.002 mm/min to 0.003 mm/min; and, the third target pulling speed $V_3$ is the reference pulling speed $V_0$±0.003 mm/min to 0.006 mm/min.

Figure 7:
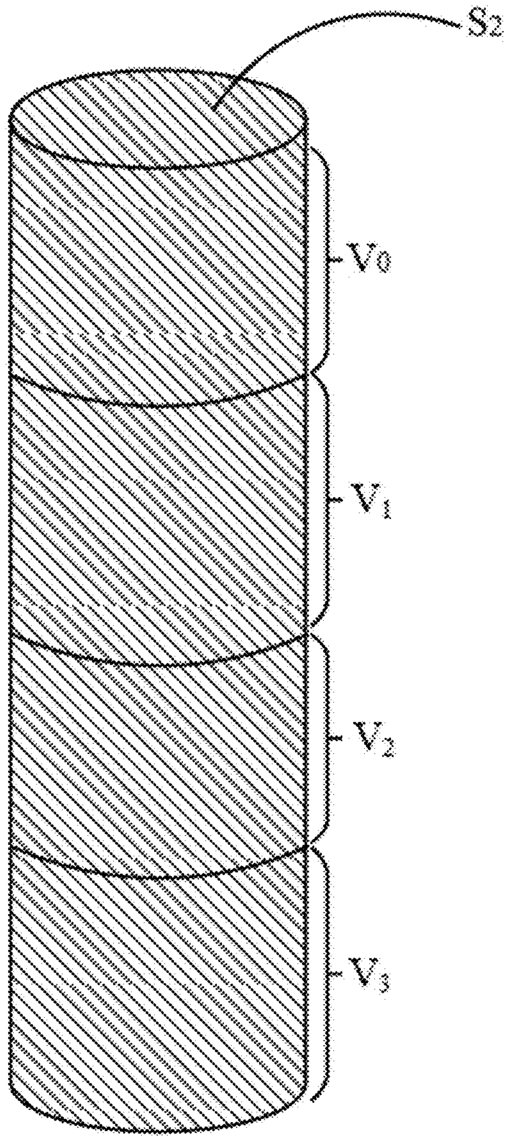
FIG. 7 is a schematic diagram of different target pulling speeds at different positions in a single crystal silicon ingot provided in the embodiments of the present disclosure.

It can be understood that, as shown in FIG. 7, in order to obtain the nitrogen-doped single crystal silicon ingot S2 with only the pure vacancy area, using different target pulling speeds for different defect areas, the method of setting target pulling speeds in segments can produce the nitrogen-doped single crystal silicon ingot S2 with only the pure vacancy area, resulting in a higher proportion of the silicon wafers with highly clean surfaces compared to the related technology.

In addition, it can be understood that compared with the nitrogen-doped single crystal silicon ingot and the reference nitrogen-doped single crystal ingot, the production process parameters of the two are the same except for the corresponding pulling speed. Specifically, the rotation speed of the crucible, the doping method of the nitrogen dopant, the Hot Zone structure, and the protective atmosphere are all the same. Therefore, by studying the defect areas of the reference nitrogen-doped single crystal silicon ingot, a method can be obtained to improve the distribution of the defect areas in the nitrogen-doped single crystal silicon ingot.

It should be noted that in the embodiments of the present disclosure, the target pulling speed of the nitrogen-doped single crystal silicon ingot S2 can be controlled within the above range by using the method of adjusting the pulling speed in the conventional technical solutions.

Refer to FIG. 7, the embodiments of the present disclosure further provide a nitrogen-doped single crystal silicon ingot, which is produced by the production method described in the above technical solutions.

It should be noted that the technical solutions recorded in the embodiments of the present disclosure can be combined arbitrarily without conflicts.

The above is only a specific implementation of the disclosure, but the scope of protection of the disclosure is not limited to this. Any changes or replacements that can easily be imagined by any skilled person familiar with the technical field within the scope of the disclosure should be covered by the scope of protection of the disclosure. Therefore, the protection scope of the disclosure should be based on the protection scope of the claims mentioned.

What is claimed is:

1. A method for producing a nitrogen-doped single crystal silicon ingot, comprising:

after cutting a reference nitrogen-doped single crystal silicon ingot into sample silicon wafers, selecting a plurality of silicon wafers to be tested; wherein selecting the plurality of silicon wafers to be tested comprises:

pulling the reference nitrogen-doped single crystal silicon ingot at a reference pulling speed V0, and cutting the reference nitrogen-doped single crystal silicon ingot to obtain the sample silicon wafers; and selecting, from the sample silicon wafers, silicon wafers located at different positions of the reference nitrogen-doped single crystal silicon ingot as the plurality of silicon wafers to be tested;

evaluating a distribution of defect areas in the plurality of silicon wafers to be tested, wherein the defect areas comprise any of the group consisting of a pure vacancy area, a pure interstitial area, and an alternating distribution area of a pure vacancy area and a pure interstitial area;

determining a distribution position of each defect area in the reference nitrogen-doped single crystal silicon ingot based on the distribution of the defect areas in the plurality of silicon wafers to be tested; and in a production process of the nitrogen-doped single crystal silicon ingot, performing a pulling at a set target pulling speed corresponding to each defect area which refers to the distribution position of each defect area in the reference nitrogen-doped single crystal silicon ingot, to produce the nitrogen-doped single crystal silicon ingot with only the pure vacancy area;

wherein in the production process of the nitrogen-doped single crystal silicon ingot, the performing the pulling at the set target pulling speed corresponding to each defect area which refers to the distribution position of each defect area in the reference nitrogen-doped single crystal silicon ingot, to produce the nitrogen-doped single crystal silicon ingot with only the pure vacancy area comprises:

when a Hot Zone structure of the nitrogen-doped single crystal silicon ingot is consistent with a Hot Zone structure of the reference nitrogen-doped single crystal silicon ingot, in the production process of the nitrogen-doped single crystal silicon ingot:

when at a position of the nitrogen-doped single crystal silicon ingot corresponding to a distribution position I of the pure vacancy area in the reference nitrogen-doped single crystal silicon ingot, pulling at the reference pulling speed V0;

when at a position of the nitrogen-doped single crystal silicon ingot corresponding to a distribution position II of the pure interstitial area surrounding the pure vacancy area in the reference nitrogen-doped single crystal silicon ingot, pulling at a first target pulling speed V1; wherein the first target pulling speed V1 is the reference pulling speed V0±0.001 mm/min to 0.002 mm/min;

when at a position of the nitrogen-doped single crystal silicon ingot corresponding to a distribution position III of the pure vacancy area surrounding the pure interstitial area in the reference nitrogen-doped single crystal silicon ingot, pulling at a second target pulling speed V2; wherein the second target pulling speed V2 is the reference pulling speed V0±0.002 mm/min to 0.003 mm/min; and when at a position of the nitrogen-doped single crystal silicon ingot corresponding to a distribution position IV of the pure interstitial area in the reference nitrogen-doped single crystal silicon ingot, pulling at a third target pulling speed V3; wherein the third target pulling speed V3 is the reference pulling speed V0±0.003 mm/min to 0.006 mm/min.

2. The method according to claim 1, wherein evaluating the distribution of the defect areas in the plurality of silicon wafers to be tested comprises:

obtaining minority carrier lifetime data on surfaces of the plurality of silicon wafers to be tested, and generating minority carrier lifetime maps based on the minority carrier lifetime data on the surfaces of the plurality of silicon wafers to be tested;

evaluating the distribution of the defect areas in the plurality of silicon wafers to be tested based on the minority carrier lifetime maps.

3. The method according to claim 2, wherein evaluating the distribution of the defect areas in the plurality of silicon wafers to be tested based on the minority carrier lifetime maps comprises:

when the minority carrier lifetime map is a map in a circle shape and with a long lifetime, determining the silicon wafer to be tested corresponding to the map in the circle shape with the long lifetime to be a first silicon wafer to be tested containing only the pure vacancy area; and when the minority carrier lifetime map is a map in a ring shape and with a short lifetime, determining the silicon wafer to be tested corresponding to the map in the ring shape and with the short lifetime to be a second silicon wafer to be tested containing the pure interstitial area surrounding the pure vacancy area; and when the minority carrier lifetime map is map in a ring shape and with a long lifetime, determining the silicon wafer to be tested corresponding to the map in the ring shape and with the long lifetime to be a third silicon wafer to be tested containing the pure vacancy area surrounding the pure interstitial area; and when the minority carrier lifetime map is a map in a circle shape and with a short lifetime, determining the silicon wafer to be tested corresponding to the map in the circle shape and with the short lifetime to be a fourth silicon wafer to be tested containing only the pure interstitial area.

4. The method according to claim 3, wherein determining the distribution position of each defect area in the reference nitrogen-doped single crystal silicon ingot based on the distribution of the defect areas in the plurality of silicon wafers to be tested comprises:

based on a position of the first silicon wafer to be tested containing only the pure vacancy area, determining the distribution position I of the pure vacancy area in the reference nitrogen-doped single crystal silicon ingot;

based on a position of the second silicon wafer to be tested containing the pure interstitial area surrounding the pure vacancy area, determining the distribution position II of the pure interstitial area surrounding the pure vacancy area in the reference nitrogen-doped single crystal silicon ingot;

based on a position of the third silicon wafer to be tested containing the pure vacancy area surrounding the pure interstitial area, determining the distribution position III of the pure vacancy area surrounding the pure interstitial area in the reference nitrogen-doped single crystal silicon ingot; and, based on a position of the fourth silicon wafer to be tested containing only the pure interstitial area, determining the distribution position IV of the pure interstitial area in the reference nitrogen-doped single crystal silicon ingot.

5. A method for producing a target nitrogen-doped single crystal silicon ingot, comprising:

pulling the target nitrogen-doped single crystal silicon ingot at a variable pulling speed to obtain the target nitrogen-doped single crystal silicon ingot having only a pure vacancy area; wherein the variable pulling speed is determined based on distribution positions of defect areas evaluated in a reference nitrogen-doped single crystal silicon ingot pulled at a constant reference pulling speed V0;

wherein a hot zone structure of the target nitrogen-doped single crystal silicon ingot is the same as a hot zone structure of the reference nitrogen-doped single crystal silicon ingot, and pulling the target nitrogen-doped single crystal silicon ingot at the variable pulling speed comprises:

when at a first position of the target nitrogen-doped single crystal silicon ingot corresponding to a first distribution position in the reference nitrogen-doped single crystal silicon ingot having only the pure vacancy area, pulling at the reference pulling speed V0, such that the first position of the target nitrogen-doped single crystal silicon ingot have only the pure vacancy area;

when at a second position of the target nitrogen-doped single crystal silicon ingot corresponding to a second distribution position in the reference nitrogen-doped single crystal silicon ingot having a pure interstitial area surrounding the pure vacancy area, pulling at a first target pulling speed V1, such that the second position of the target nitrogen-doped single crystal silicon ingot have only the pure vacancy area; wherein the first target pulling speed V1 is the reference pulling speed V0±0.001 mm/min to 0.002 mm/min;

when at a third position of the target nitrogen-doped single crystal silicon ingot corresponding to a third distribution position in the reference nitrogen-doped single crystal silicon ingot having the pure vacancy area surrounding the pure interstitial area, pulling at a second target pulling speed V2, such that the third position of the target nitrogen-doped single crystal silicon ingot have only the pure vacancy area; wherein the second target pulling speed V2 is the reference pulling speed V0±0.002 mm/min to 0.003 mm/min; and when at a fourth position of the target nitrogen-doped single crystal silicon ingot corresponding to a fourth distribution position in the reference nitrogen-doped single crystal silicon ingot having only the pure interstitial area, pulling at a third target pulling speed V3, such that the fourth position of the target nitrogen-doped single crystal silicon ingot have only the pure vacancy area; wherein the third target pulling speed V3 is the reference pulling speed V0±0.003 mm/min to 0.006 mm/min.

* * * * *